(12) United States Patent  (10) Patent No.: US 7,576,478 B2
Hikmet  (45) Date of Patent: Aug. 18, 2009

(54) ELECTRICALLY CONTROLLABLE COLOR CONVERSION CELL

(75) Inventor: Rifat Ata Mustafa Hikmet, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 136 days.

(21) Appl. No.: 10/599,842

(22) PCT Filed: Apr. 6, 2005

(86) PCT No.: PCT/IB2005/051129

§ 371 (c)(1), (2), (4) Date: Oct. 11, 2006

(87) PCT Pub. No.: WO2005/101445

PCT Pub. Date: Oct. 27, 2005

(65) Prior Publication Data

US 2007/0273265 A1   Nov. 29, 2007

(30) Foreign Application Priority Data

Apr. 15, 2004 (EP) .................................. 04101541

(51) Int. Cl.
 *C09K 19/52* (2006.01)
 *C09K 19/60* (2006.01)
 *H01J 61/42* (2006.01)
 *H01J 61/40* (2006.01)

(52) U.S. Cl. ................. 313/110; 313/111; 313/112; 349/164; 349/165; 349/79; 349/115

(58) Field of Classification Search ......... 313/500–512, 313/110–112; 349/164, 165, 104, 115, 79
See application file for complete search history.

(56) References Cited

U.S. PATENT DOCUMENTS 3,960,753 A * 6/1976 Larrabee ..................... 349/164
4,416,515 A * 11/1983 Funada et al. ............... 349/164
5,745,203 A * 4/1998 Valliath et al. .............. 349/113

(Continued)

FOREIGN PATENT DOCUMENTS

JP   09258272 A  * 10/1997

(Continued)

OTHER PUBLICATIONS

R.A. Hayes et al; "Video-Speed Electronic Paper Based on Electrowetting", Nature, vol. 425, 2003, pp. 383-385, XP002333600.

*Primary Examiner*—Mariceli Santiago
(74) *Attorney, Agent, or Firm*—Larry Liberchuk (57) ABSTRACT

The invention relates to light emitting devices (2) with variable output color. More specifically, the inventions provides a color conversion cell (10) which can be positioned in front of a light source (4) in order to generate other color or color temperatures. Typically the light source is a light emitting diode (LED) which is power efficient but emits in a narrow and fixed spectra. The new colors are generated by photoluminescence in fluorescent dyes contained in the cell. The color converting of the cell is electrically controllable, preferably by controlling the orientation, density or distribution of the fluorescent dyes, or by controlling a pathlength of the light in the cell.

10 Claims, 7 Drawing Sheets

U.S. PATENT DOCUMENTS

| | | | |
|---|---|---|---|
| 5,762,823 A * | 6/1998 | Hikmet | 252/299.01 |
| 6,211,931 B1 * | 4/2001 | Fukao et al. | 349/86 |
| 6,252,254 B1 | 6/2001 | Soules et al. | |
| 6,357,889 B1 | 3/2002 | Duggal et al. | |
| 2002/0158565 A1 | 10/2002 | Setlur et al. | |
| 2004/0150613 A1 * | 8/2004 | Li et al. | 345/107 |
| 2005/0104804 A1 * | 5/2005 | Feenstra et al. | 345/41 |

FOREIGN PATENT DOCUMENTS

| | | | |
|---|---|---|---|
| JP | 10206850 A | * | 8/1998 |
| JP | 2001343671 A | * | 12/2001 |
| JP | 2002116325 | | 4/2002 |
| WO | 9854030 A1 | | 12/1998 |
| WO | 0033390 A | | 6/2000 |
| WO | 0136864 A2 | | 5/2001 |

* cited by examiner

ELECTRICALLY CONTROLLABLE COLOR CONVERSION CELL

FIELD OF THE INVENTION

The invention relates to diode light sources with variable output color.

BACKGROUND OF THE INVENTION

Methods for varying the color of a light source can be divided into two cases, passive color conversion where filters etc. remove some frequencies to change the color, and active color conversion where fluorescent or phosphorescent substances alters the spectrum of the light from the light source by absorption and re-emission. Active color conversion has the advantages that it maintains the light power to a higher degree than passive color conversion. Further, active color conversion can produce wavelengths not contained in, or increase emission at wavelengths only weakly represented in, the emission spectrum of the light source. For this reason, active color converting substances are preferred for adjusting colors and color temperatures.

Light emitting diodes (LED's) are considered to become the next generation of lighting sources. Highly efficient inorganic diodes emit a band of light usually in the blue or red part of the spectrum. Green is usually obtained by converting blue light using green phosphor and white emitting diodes are obtained by converting blue light using green and red phosphors.

However, it is very desirable to be able to adjust the color characteristics of a diode light source in an electrically controllable way.

U.S. Pat. No. 6,375,889 describes a light source emitting light with a variable wavelength spectrum. The light source has multiple diodes with different emission spectra and a transmissive plate coated with a phosphor coating. The phosphor coating converts the color of the diodes by absorbing and re-emitting part of the incident light. The color of the light source is determined by the spectrum incident on the color converting phosphor coating, which is controlled by adjusting the relative emission intensity of the diodes.

This approach has the drawback that diodes emitting different colors age in different ways, so that the relative intensities giving a desired color will change over time. It is therefore necessary to use feedback based on e.g. a photo diode in order to compensate for this effect.

It is a disadvantage of the light source described in U.S. Pat. No. 6,375,889, that it is the emission intensity of the diodes, which is used to control the color. Firstly, for a given color of the light source, the diodes that contribute only little to this color must emit at a very low intensity—even though the light source as a whole emits the color at its highest intensity. Therefore, the maximum light intensities of the individual diodes must be grossly overdimensioned compared to the maximum output intensity of the light source.

Secondly, the color converting phosphors respond differently to the different emission spectra of the diodes. For a specific color and intensity of the light source, the diodes emit with a given relative intensity. If the intensity of the light source is to be adjusted while maintaining the color, adjusting the overall diode intensity with fixed relative intensity may alter the output color due to the varying response of the color converting phosphors. The relative intensity of the diodes must therefore be adjusted according to a feedback from a photo diode to keep the color mixing constant. This makes it difficult to perform the simple task of dimming a light source without changing its color.

SUMMARY OF THE INVENTION

It is an object of the invention to provide a color conversion cell to be applied in a method and a light emitting device, where the color or the color temperature can be electrically controlled.

According to the present invention, a color conversion cell with an active color converting substance is used to perform and control the color conversion of light from a light source.

Thus, in a first aspect the invention provides a color conversion cell comprising a color converting substance in a matrix held between two electrodes, the color converting substance having a second emission spectrum different from the first emission spectrum, the color conversion cell being electrically shiftable between at least a first state wherein the color converting substance will     absorb a first ratio, $A_1$, of light incident on the cell,
    emit light with the second emission spectrum, and
    transmit a second ratio, $T_1$, of light incident on the cell, and a second state wherein the first ratio, $A_2$, is smaller than in the first state and wherein the second ratio, $T_2$, is larger than in the first state.

The cell has two opposing and at least substantially transparent walls allowing light to pass through the cell when empty. The two electrodes are preferably transparent and form part of these walls.

The color converting substance is based on a photoluminescent substance such as fluorescent or phosphorescent dyes. The substance preferably has a high absorption at the first frequency spectrum and emits at the second frequency spectrum which may or may not overlap partially or completely with the first spectrum. The color converting substance may be formed by particles such as polymers, crystals, clusters, molecules, atoms etc., and may be fluid or solid. The matrix is the medium in which the substance is suspended, dissolved or embedded.

The color conversion can be controlled by controlling the degree to which the color from the light source is shifted to another color. The degree to which the color from a light source is shifted depends on how much of the light is absorbed and re-emitted by the color converting substance. Thus, the color conversion may be controlled by adjusting one or more of the following parameters:

the pathlength of the source light through color converting substance,
    the color converting substance's density, distribution or extent in the media traversed by the source light,
    the absorption cross section of the color converting substance, i.e. the probability that a photon will be absorbed by a particle of the color converting substance.

The color conversion cell may be shifted between the first and second state by adjusting one or more of the parameters mentioned above. The first ratio, $A_x$, is an absorption coefficient defined as the quotient between absorbed light and incident light in the state X. It follows that $0 \leq A_x \leq 1$. Similarly, second ratio, $T_x$, is a transmission coefficient defined as the quotient between transmitted light and incident light in the state X. It also follows that $0 \leq T_x \leq 1$. Preferably, the one or more parameters may be adjusted continuously to allow for a smooth transition between two color states. It is thus evident that the first and second ratios may take several values in between their values in the first and second state.

If there where no absorption, $A_x=0$, the color converting substance would not emit any light, and similarly, if all light was absorbed, $A_x=1$, the color converting substance would not transmit any light. However, unless $A_x$ is exactly equal to 0 or 1, there will be some absorption, some emission and some transmission, which is generally the case.

In a preferred embodiment, the color converting substance comprises anisometric color converting particles. The absorption cross section of such anisometric particles depends of their orientation relative to the propagation direction of the incident light. The anisometric color converting particles therefore have a high absorption orientation and a low absorption orientation in relation to light incident on the cell or particle. In this embodiment, the color conversion cell comprises means for controlling the orientation of the particles so that the anisometric particles can be at least substantially oriented in their high/low absorption orientations relative to the source light when the cell is in the first/second state.

The anisometric color converting particles may be dichroic fluorescent dye molecules having a larger absorption cross section in one orientation than in another. The molecules may be dichroic because of anisometric shape or because of intramolecular properties. Dichroic color converting particles may e.g. be rod-like molecules or disc like molecules, where the absorption cross section is high for light polarized parallel to the long axis of the molecule, and small for other orientations.

Alternatively, the anisometric color converting particles may be fluorescent dye particles shaped as flakes, rods, discs, ellipsoids, etc. where the amount of light incident on the particle depends on the alignment of the particle relative to the light.

In another alternative, the anisometric particles need not be fluorescent dyes themselves, but can have color converting substance attached to their surfaces. As the amount of light incident on the particle surface, and thereby on the color converting substance, depends on the alignment of the alignment. Here, the color converting substance itself may be isometric, which allows for a much larger selection of substances.

In one preferred embodiment, the means for controlling the orientating the anisometric color converting particles comprises a liquid crystal mixture containing fluorescent dichroic dye molecules. Here, anisometric and/or dichroic color converting particles are typically mixed with liquid crystals and the mixture is placed in a cell containing orientation layers as on top of transparent electrodes. Under the influence of the orientation layers the liquid crystal mixture become macroscopically oriented.

It is also possible to use various configurations in order to avoid polarization dependence. One such configuration is so called twisted configuration and involves rotation of the liquid crystal molecules within the cell. Such configuration is induced when a liquid crystal is provided with so-called chiral molecules. The orientation of the liquid crystal and hence the dichroic molecules can be altered when an electric field is applied across the cell. As an alternative, the means for controlling the orienting involves a suspended particle device wherein anisometric color converting particles are suspended in a liquid. In both alternatives, the means for controlling the orientation comprises the two electrodes and a voltage difference between these.

In another preferred embodiment, the color conversion cell involves an electrowetting cell as described in e.g. Nature 425, p. 383, hereby included by reference. The color converting substance can be mixed with an apolar liquid held together with a polar liquid in a small compartment with a hydrophobic surface which form a transparent section of the cell. By switching a voltage between the polar liquid and the hydrophobic surface, the apolar liquid will switchably wet the hydrophobic surface. This can be used to control how much of the transparent section of the cell that is covered with the color converting substance. In the first state of the color conversion cell, the apolar liquid will wet the hydrophobic surface so that the source light will illuminate the color converting substance. In the second state of the color conversion cell, the apolar liquid will at least substantially withdraw from said surface of the transparent section.

In still another preferred embodiment, the color conversion cell is adapted to adjust an average pathlength of the source light in the matrix containing the color converting substance inside the cell. If the average pathlength of the source light is longer in the first state of the cell than in the second state, more light will be absorbed and re-emitted in the first state, resulting on a larger color conversion. The pathlength may be adjusted by scattering the source light in the matrix, with an increased scattering leading to a longer pathlength. To this point, the color conversion cell preferably comprises electrically controllable scattering media such as polymer dispersed liquid crystal or liquid crystal gel or chiral texture. This embodiment have the advantage that the color converting substance need not be dichroic or anisometric, thus providing a larger selection of applicable substances. However the effect may be increased when anisometric particles or dichroic molecules are used.

Electrically controllable scattering can be obtained in various ways. The most known materials, which can be used for this purpose, are the polymer dispersed liquid crystal (PDLC), gels and cholesteric texture. PDLC is obtained when liquid crystal molecules are dispersed in an isotropic polymer. In the field off state liquid crystal molecules are oriented randomly in the polymeric matrix and the light is scattered randomly in all directions. Upon application of an electric field the scattering gradually decreases and when the liquid crystal molecules become totally aligned in the direction of the electric field the ordinary refractive index of the molecules match the refractive index of the polymer so the cell becomes transparent. In the case of the gels giving polarisation independent scattering, liquid crystals with negative dielectric anisotropy dispersed in an oriented anisotropic polymer matrix are preferably used. In the field off state the anisotropic network is oriented within the LC therefore there is no refractive index fluctuations within the cell so that the cell appears to be transparent. Upon applying an electric field across the gel the molecules tend to become oriented perpendicular to the applied field creating domains with various LC orientations causing scattering of light.

In the case of cholesteric texture surface treatment or polymer is used in order to induce the so-called focal conic texture in the liquid crystal which shows strong scattering of light. Upon application of an electric field liquid crystal molecules become aligned in the direction of the field and the scattering texture disappears.

The pathlength of the light may also be increased by a switchable resonating structure holding a color converting substance. The cell may comprise a thin layer of color converting material and a switchable reflector reflecting the spectrum of the light source but not the spectrum of the color converting substance. Also, the light source typically has a built-in reflector. In the on state of the reflector, light from the source resonate many times between the reflector of the color conversion cell and the reflector of the light source, thereby passing through the color converting substance many times. When the switchable reflector is not reflecting then light beam pass through the color converting substance only once. An example of a switchable mirror is cholesteric mirror as described in e.g. U.S. Pat. No. 5,762,823.

In a second aspect, the invention provides a light emitting device with adjustable color or color temperature comprising a light source having a first emission spectrum and a color conversion cell according to the first aspect of the invention. The color conversion cell is arranged to allow light from the light source to pass through the cell when empty.

Light emitted by the color converting substance will be emitted isotropically, some will be emitted in the direction of the source light whereas some will be emitted back towards the light source. In a preferred embodiment, the light emitting device comprises a reflector positioned between the light source and the color conversion cell, the reflector being at least substantially transparent for the source light and at least substantially reflective for light emitted by the color converting substance. The reflector reflects light emitted in directions back towards the light source. The reflector may be based on cholesteric liquid crystals or is a multi-layer dielectric reflector.

The efficiency of the color conversion can be improved by increasing the intensity of source light incident on the cell. For this purpose, the light emitting device may further comprise a layer with a collimating micro structure such as a lens or a grating positioned between the light source and the color conversion cell.

To allow for color mixing, the light emitting device may comprise multiple color conversion cells having different color converting substances. Arranging the cells behind one another as seen from the light source allows the light source to illuminate a succeeding cell through a preceding cell. Source light transmitted or emitted by the preceding cell may be converted by the succeeding cell resulting in multiple color conversion of the source light.

In a third aspect, the invention provides a method for adjusting the color or color temperature of light from a light source having a first spectrum, the method comprising the steps of     providing a color conversion cell comprising a color converting substance in a matrix held between two electrodes,     illuminating the matrix with the light source,     absorbing at least part of the source light illuminating the matrix in/by the color converting substance,     emitting light with a second emission spectrum from the color converting substance,     adjusting a voltage between the two electrodes to increase or decrease the amount of source light absorbed by the color converting substance and the amount of light with a second emission spectrum emitted by the color converting substance.

The basic idea of the invention is to control the color conversion by adjusting the color conversion of the incident light, instead of adjusting the amount incident light. This separates the light intensity, which is determined by the light source, and the light color, which is controlled by the color conversion cell(s).

These and other aspects of the invention will be apparent from and elucidated with reference to the embodiments described hereinafter.

BRIEF DESCRIPTION OF THE DRAWINGS

FIGS. 9A and B are cross sectional view of a cell illustrating scattering of light for different states of the cell.

DETAILED DESCRIPTION OF PREFERRED EMBODIMENTS

Figure 1:
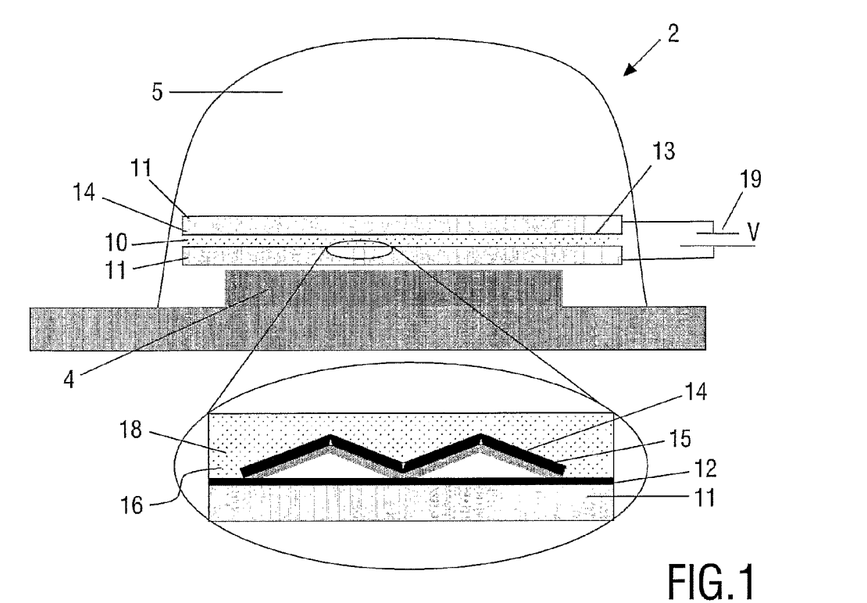
FIG. 1 is a cross sectional view of a light emitting device according to the invention.

The following description proposes several light emitting devices for performing electrically controllable color conversion based on adjustable absorption and reemission by a color converting substance, typically a fluorescent dye. FIG. 1 illustrates a typical layout of such light emitting device. The designs presented in the present description primarily serves to illustrate the working principle of the invention and its embodiments, and secondly to present ways for carrying out the invention. These designs are not intended to restrict the scope of the invention in any way.

In FIG. 1, a light emitting device 2 comprises an LED light source 4 and a color conversion cell 10, all encapsulated in a lens 5. The cell 10 has transparent glass walls 11 with transparent electrodes 12 and 13 and a reflector 15 at the wall nearest the LED. The cell contains a color converting substance 18 mixed in a liquid matrix 16. The orientation of either the constituents of the matrix 16, the color converting substance 18, or both can be controlled by controlling a voltage between electrodes 12 and 13 with the voltage supply 19.

Most preferred material for the electrode is indium tin oxide (ITO) which show high transparency and good conductivity. Depending on the type of device used the thickness of the gap containing the liquid will be in the range of 10-200 µm. The concentration of the color converting substance will be in the range 0.1-10%.

The color converting substance of the cell 10 emits in all directions. In order to redirect the light emitted through the wall 11 of the cell plate facing the LED 4, a reflecting layer 15 is positioned between the LED 4 and the matrix 16. The reflector 15 serves to transmit the light from the LED 4 but reflect the light emitted by the color converting substance. Such a layer may be a dielectric multilayer mirror, and may contain a structure or have a curvature in order to direct the reflected light in a certain direction.

In a first preferred embodiment, the absorption and reemission is adjusted by controlling the orientation of particles in a matrix relative to the direction of light. Since the orientation is adjusted in relation to the light from the light source, collimated light is preferred to have a well defined directionality of the light and ensure optimal performance. The first preferred embodiment has a number of different implementations described in the following in relation to FIGS. 1 through 10.

In one implementation, the matrix 16 can be a liquid crystal matrix with a color converting substance 18 such as dichroic fluorescent dye molecules homogeneously mixed therein. The dichroic fluorescent dye molecules have a much higher absorption coefficient for light polarized along the long axis of the molecules than in lateral directions. As a result, the strength of absorption, and hence the intensity of their emission, can be controlled by controlling their orientation. As the liquid crystals can be reoriented by electric fields, the absorption/emission characteristics of the dye molecules can be controlled using a voltage supply 19. An orientation layer 14 is added in the cell 10 to inducing a macroscopic orientation of the liquid crystals. For example rubbed polymer surfaces induce uniaxial planar orientation in liquid crystals while most other surfactants induce perpendicular alignment of the long axis of the liquid crystals with respect to the surfaces. Different orientation layers for inducing various orientations are well known to the person skilled in the art. Orientation layer 14 can also provide electrical isolation between the liquid and the solid substrate.

Figure 2:
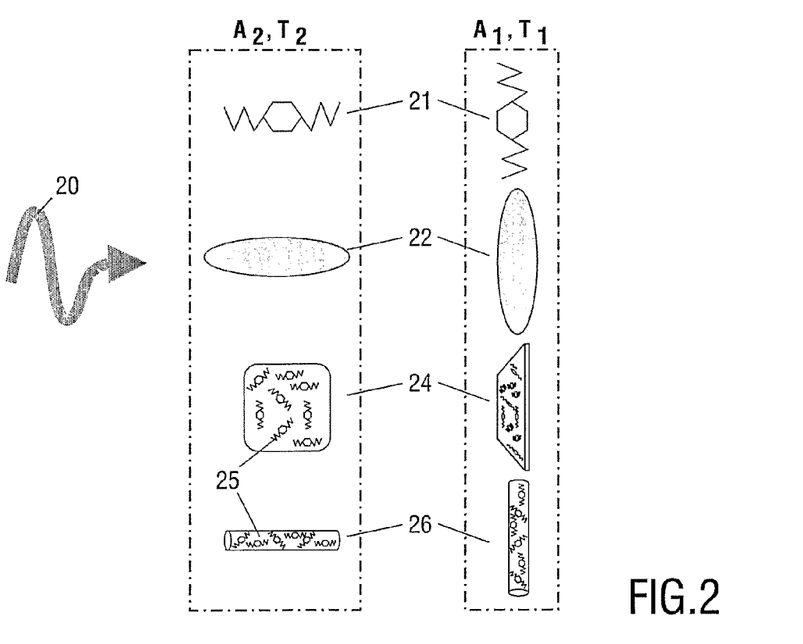
FIG. 2 illustrates high and low absorption orientations of preferred types of color converting substances.

In FIG. 2, a dichroic fluorescent dye molecules 21 is shown in its low absorption orientation (column $A_2,T_2$) and its high absorption orientation (column $A_1,T_1$) in relation incident light 20. The orientation of the dye molecules 21 follows the orientation of a long axis of the liquid crystals in matrix 16. If the liquid crystals have positive dielectric anisotropy their long axis will be aligned normal to the electrodes when $V \neq 0$, and, with a proper surface treatment, aligned parallel to the electrodes when $V=0$. Oppositely, if the liquid crystals have negative dielectric anisotropy their long axis will be aligned normal to the electrodes when $V=0$ and parallel to the electrodes when $V \neq 0$.

As light from an LED is unpolarized, and since liquid crystals in their "relaxed state", $V=0$, are still aligned, only half of the incident light will be polarized parallel to the long axis of the crystals. Dichroic dye molecules show a high absorption towards light polarized along their long axis, and thus the aligned molecules will only have their high absorption orientation relative to half of the light. When applying dichroic dye molecules, it may therefore be necessary to apply a specially designed color conversion cell 30 shown in FIG. 3. The cell 30 contains two liquid crystal matrices 32 and 34 with uniaxially oriented liquid crystals and dichroic fluorescent dye molecules. Orientation of the matrices 32 and 34 is made so that molecular orientations is 90 degree with respect to each other when $V=0$.

Thus in a first state of the cell 10, the liquid crystals can orient the dye molecules 21 in their high absorption orientation in relation to light from the LED light source 4. Adjusting the voltage between electrodes 12 and 13 can switch the cell 10 to a second state where the liquid crystals orient the dye molecules 21 in their low absorption orientation in relation to light from the LED light source 4.

There exist a number of alternatives to the dichroic fluorescent dye molecules. FIG. 2 further shows other particles in low and high absorption orientations:

an anisometric particle 22 of a photoluminescent material composition (could also be disc-like), sheet-like or disc-like particles 24 with fluorescent dye molecules 25 attached to the surface. One example being aluminumoxide flakes of thickness ~100 nm and ~1 µm diameter, and rod-like particles 26 with fluorescent dye molecules 25 attached to the surface.

Figure 3:
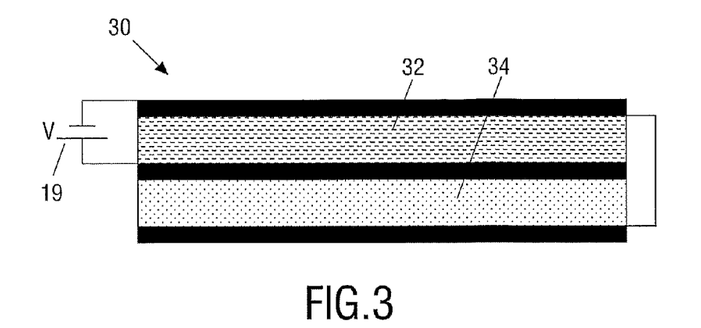
FIG. 3 is a cross sectional view of a color conversion cell applying anisometric fluorescent dye molecules in liquid crystals.

In those cases, proper alignment of the liquid crystals orients the particles in their low absorption orientation ($A_2$, $T_2$—column in FIG. 2) which dramatically reduces the light incident on the color converting particles as compared to their high absorption orientation ($A_1$, $T_1$—column in FIG. 2), and thereby reduces their absorption and re-emission. With these alternatives offer, non-dichroic dyes can also be used. This means that the fluorescent dye can be chosen from a much larger selection of dyes, offering a larger variety of absorption/emission spectra. Also, these particles does not have the inherent polarization dependence of dichroic particles, whereby the cell design 30 described in relation to FIG. 3 is not necessary.

In another implementation, the cell 10 contains a suspended particle device (SPD) instead of the liquid crystal matrix. Here, anisometric particles with large aspect ratios are suspended in a liquid. When no electric field is present, the particles will be randomly oriented, but applying a voltage between electrodes 12 and 13 will align the particles. The suspended particles themselves can be anisometric color converting particles 22 such as fluorescent plate or rod like particles. Alternatively, fluorescent dye molecules 25 may be attached to the surface of, or be incorporated inside, the larger suspended particles similar to particles 24 and 26.

Figure 4:
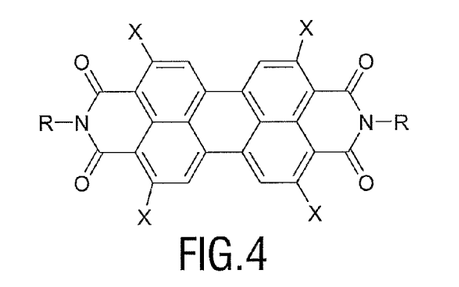
FIG. 4 is the molecular formula for a dichroic fluorescent dye molecule.

A test cell similar to the cell 10 of the preferred embodiment described in relation to FIG. 1 was fabricated to demonstrate the working principle of the invention. FIG. 4 shows the structure of a dichroic fluorescent perylene derivative dye dissolved (5% concentration) in a liquid crystal matrix (Zli 4788). This fluorescent dye has a high absorption in the range of 400-530 nm and emits in the range 500-650 nm.

Figure 5:
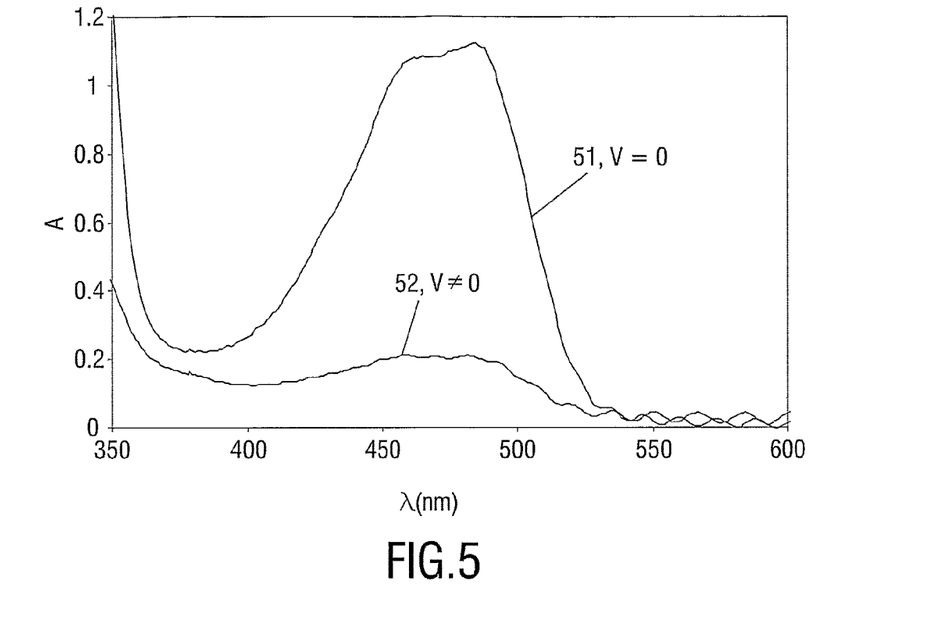
FIG. 5 is a graph showing absorption spectra of the dichroic fluorescent dye molecule of FIG. 4 for different states of a cell.

FIG. 5 shows the absorption, A (in arbitrary units), as a function of the wavelength λ for the cell in its first and second state.

Spectrum 51 where the cell is in its first state with $V=0$. The liquid crystals are aligned normal to the direction of the incident light. Hence the molecular long axis of the dichroic fluorescent dye is parallel to the polarization of the light resulting in a high absorption, Spectrum 52 where the cell is in its second state with $V \neq 0$. The liquid crystals are aligned parallel with the direction of the incident light. In this case, the molecular long axis of the dichroic fluorescent dye is parallel to the direction of the light and thereby normal to the polarization of the light, resulting in a low absorption.

Figure 6:
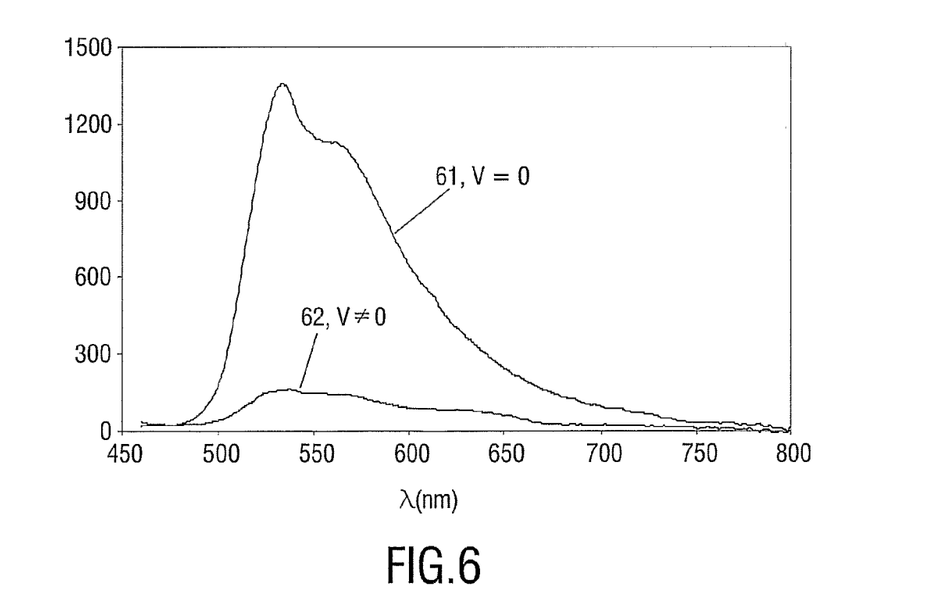
FIG. 6 is a graph showing emission spectra of the dichroic fluorescent dye molecule of FIG. 4 for different states of a cell.

In FIG. 6, the emission intensity, I (in arbitrary units), are shown as a function of the emission wavelength λ for the two states of the cell.

Spectrum 61 where the cell is in its first state with $V=0$, this corresponds to absorption spectrum 41. The dichroic fluorescent dye molecules are aligned in their high absorption orientation in relation to the incident light. This gives a high absorption and a corresponding large emission in the emission spectrum of the dye, 500-650 nm.

Spectrum 62 where the cell is in its second state with $V \neq 0$, this corresponds to absorption spectrum 42. The dichroic fluorescent dye molecules are aligned in their low absorption orientation. As very little light is absorbed, the corresponding emission is very low.

It can be seen that the highest emission is obtained in the state or orientation in which the molecules show the largest absorption. This indicates that when such a cell is used in a light emitting device with a blue LED, a part of the blue light can be absorbed and re-emitted at longer wavelengths, thereby changing the emission characteristics of the LED. As the orientation of the fluorescent dye molecules depend on the applied electric field, the emission spectrum of the light emitting device can be electrically controlled.

Figure 7:
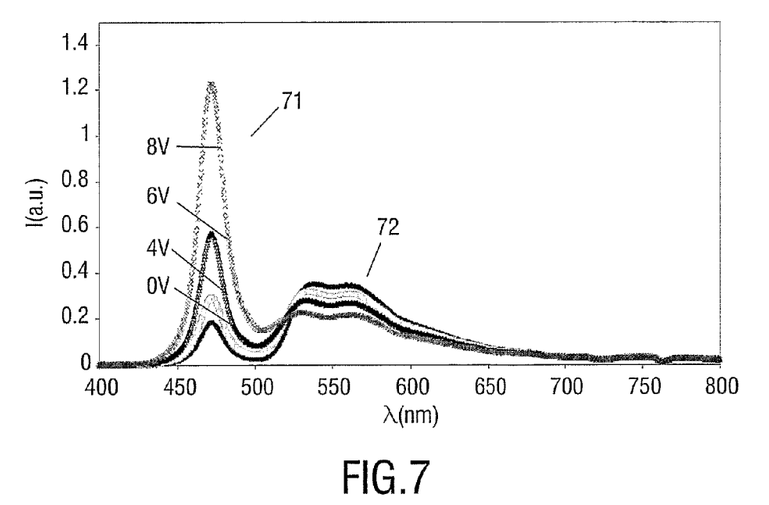
FIG. 7 is a graph showing emission spectra for a light source and a color converting substance for different states of a cell.

Light emitting device with a blue LED and a cell similar to the cell 30 described in relation to FIG. 3 has been fabricated using the dye shown in FIG. 4. FIG. 7 shows the emission spectra of the fabricated light emitting device, illustrating the change of the blue LED spectra for various voltages applied across the cell. It can be seen that for low voltages, a large ratio of the blue LED light (peak 71 centered at 470 nm) is absorbed and re-emitted in the range 525 nm-580 nm (peak 72). For increasing voltages, less blue LED light is absorbed and the emission from the dye decreases correspondingly.

Figure 8:
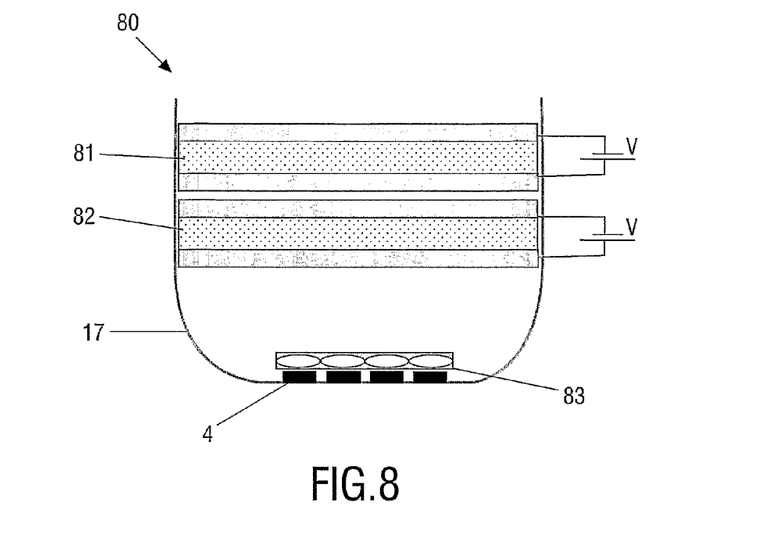
FIG. 8 is a cross sectional view of another light emitting device according to the invention.

FIG. 8 shows another light emitting device 80 according to the first preferred embodiment. The light emitting device 80 has several LEDs 4 illuminating multiple cells 81 and 82 with fluorescent dyes having different emission spectra. Combining e.g. blue LEDs with green and red emitting electrically controllable color conversion cells 81 and 82, a light emitting device with controllable color and color temperature for use in e.g. lighting applications can be produced. Also, the light emitting device has no lens, but a reflector 17 reflecting both light from LEDs 4 and from the cells 81, 82. A microstructured layer 83, such as a set of lenses, is positioned between the LEDs 4 and the cells 81, 82 to collimate the light from LEDs 4.

Figures 9A, 9B:
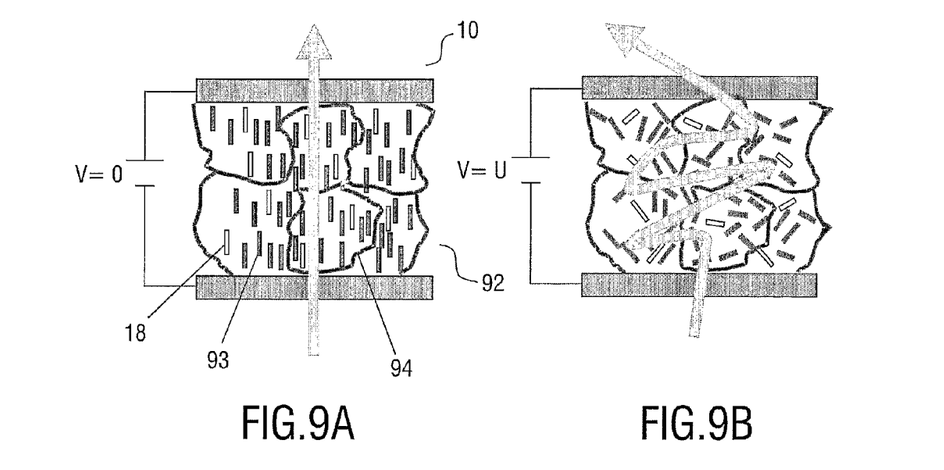

FIGS. 9A and B show still another implementation of the preferred embodiment. Here, the cell 10 contains an anisotropic gel 92 consisting of liquid crystal 93 with negative dielectric anisotropy in an anisotropic polymer 94. A color converting substance 18 is mixed and oriented together with liquid crystal molecules. The gel was produced by adding the fluorescent dye of FIG. 4 to a mixture of non reactive liquid crystal molecules with 4% liquid crystal molecules with reactive end groups. The mixture was placed in a cell with transparent electrodes and an orientation layer which induced macroscopic orientation within the LC molecules so that they became oriented perpendicular to the cell surfaces. In this state the cell does not show any scattering and in with this orientation the absorption by the dye molecules is the lowest.

Upon application of an electric field, FIG. 9B, the dye and liquid crystal molecules tend to orient their long axis perpendicular to the applied field and cause the formation of domains giving rise to refractive index fluctuations within the cell causing strong light scattering. As the molecules tend to become perpendicular to the applied field they start also absorbing more light. The longer pathlength naturally also gives more incident light on the color converting substance and thereby a further increase in the absorption of light. Another advantage of this implementation is that the orientation of the color converting substance is random so that there is no polarization dependence.

Figure 10:
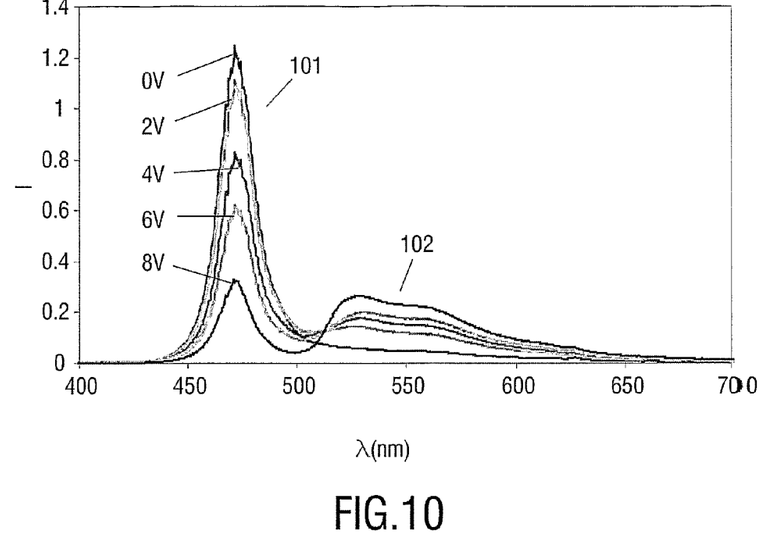
FIG. 10 is a graph showing emission spectra of a color converting substance for different states of a cell.

Similarly to the emission spectra shown in FIG. 7, FIG. 10 shows emission spectra of a light emitting device with a blue LED and the cell 90 described in relation to FIG. 9.

The emission spectrum of the light emitting device is shown at various applied voltages across the cell. It can be seen that with increasing voltage, more blue LED light (peak 101) becomes absorbed and re-emitted as yellow light (peak 102) from the fluorescent dye in the cell.

Figure 11:
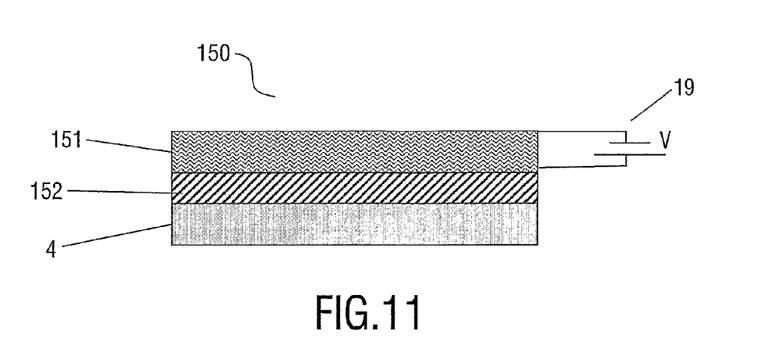
FIG. 11 is a cross sectional view of a light emitting device with a switchable reflector.

FIG. 11 shows still another implementation of the color conversion cell 150. Here, the cell has a layer 152 of color converting substance covered by a switchable reflector 151 controlled by the voltage supply 19. The reflector can e.g. be a switchable cholesteric gel reflecting a band of light corresponding to the spectrum of the light source 4. In the off state with V=0, the light resonates between the mirror and the source and mainly the converted spectrum comes out. In the on state, V≠0, mainly the light from the light from the source comes out.

In a second preferred embodiment, the absorption and reemission is adjusted by controlling the density, distribution or presence of color converting substance in a matrix. In this embodiment, the orientation of the color converting substances in relation to the light is of no consequence, and the light need not be collimated for optimal performance. Also, as the lack of directionality allows all fluorescent dye to be used isometric and anisometric. The second preferred embodiment is described in a number of different implementations in the following and in relation to FIGS. 1 and 11 through 13.

In a first implementation of the second embodiment, the cell 10 of the light emitting device 2 of FIG. 1 adjust the distribution of the color converting substance 18 by electrowetting.

Figure 12A:
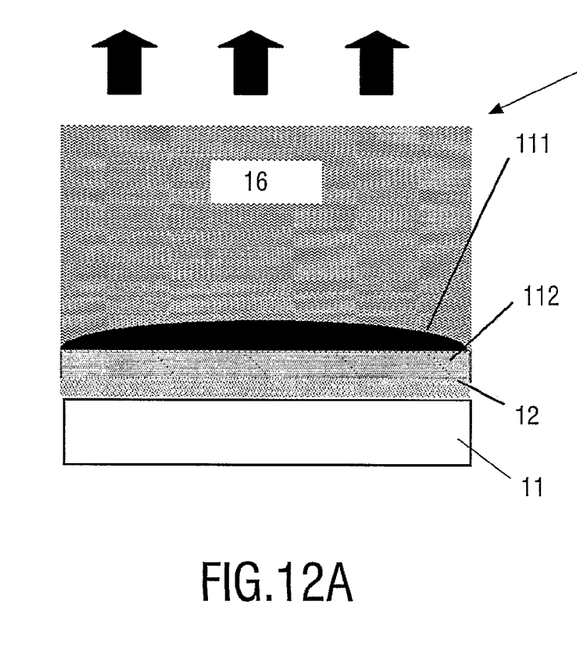
FIGS. 12A and B illustrates different states of a color conversion cell based on electrowetting.

The working principle of an electrowetting cell 110 is shown in FIGS. 12A and B. Here a polar liquid droplet 111 is placed in an apolar matrix 16 on a hydrophobic coating 112 on an inside surface of the cell wall 11. Due to the hydrostatic forces of the system, the droplet 11 does not spread but remains as a droplet in a corner of the cell, FIG. 12B. However, upon application of a voltage between electrode 12 and apolar matrix 16, the droplet 111 it spreads on the surface coating 112, FIG. 12A (Electrowetting).

Figure 12B:
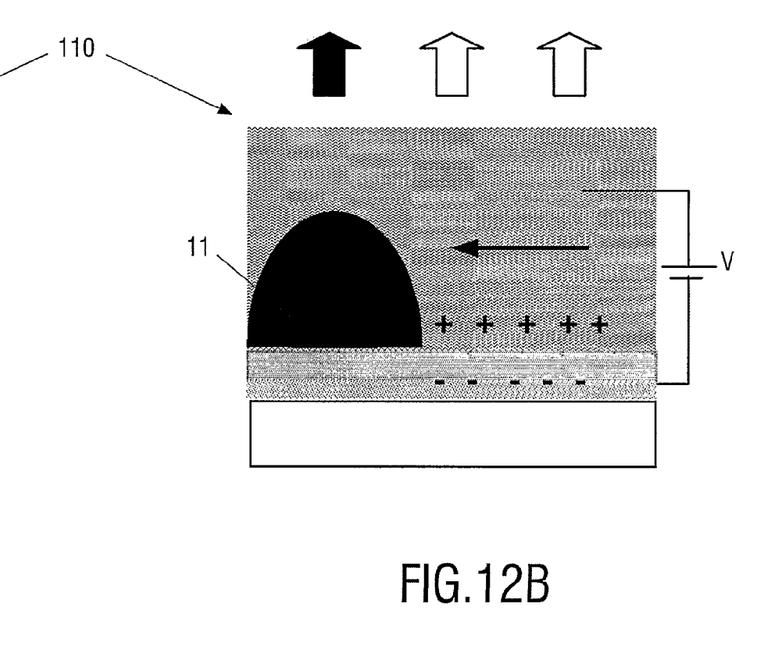

By controlling the applied voltage, the coverage of the polar liquid 111 containing the color converting substance is adjusted. As more of the illuminated surface area is covered, or as the thickness of the polar liquid layer increases, more light will be absorbed and re-emitted at other wavelengths. Thus by electrically controlling the distribution of color converting substance in the cell, the color and the color temperature of the light source can be controlled.

Various kinds of fluorescent dyes can be used. Nano phosphors based on quantum dots (QD) might be particularly interesting as they show extremely high efficiencies, are very stable. Furthermore, their emission spectrum can be continuously tuned in wavelength simply by tuning their physical size. As an example, core-shell CdSe/ZnS nanocrystals exhibit strong band-edge photoluminescence with room temperature quantum efficiencies as high as 30-70%. The spectral position of the emission band is tunable from blue to red with increasing the size of CdSe core from ~2 to 6 nm. Thin (~2 monolayers) ZnS epitaxial shell grown around CdSe core considerably improves particle stability and the luminescence efficiency.

QDs are preferably prepared by wet chemical processes, and transfer molecules 15 are added to the surface after formation of the QD. QDs are semiconductor nanometer crystals and may comprise Group [II-VI] semiconductor compounds such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe and HgTe; and/or crystals of Group [III-V] semiconductor compounds such as GaAs, GaP, InN, InAs, InP and InSb; and/or crystals of group IV semiconductor compounds such as Si and Ge. In addition, the semiconductor compounds may be doped with rare earth metal cations or transition metal cations such as $Eu^{3+}$, $Tb^{3+}$, $Mn^{2+}$, $Ag^+$ or $Cu^+$. It may be possible that a QD consists of two ore more semiconductor compounds. Most likely the QDs comprise InN, InGaP or GaAs. The radii of the QDs are smaller than the exciton Bohr radius of the respective bulk material. Most likely the QDs have radii no larger than about 10 nm.

Figure 13:
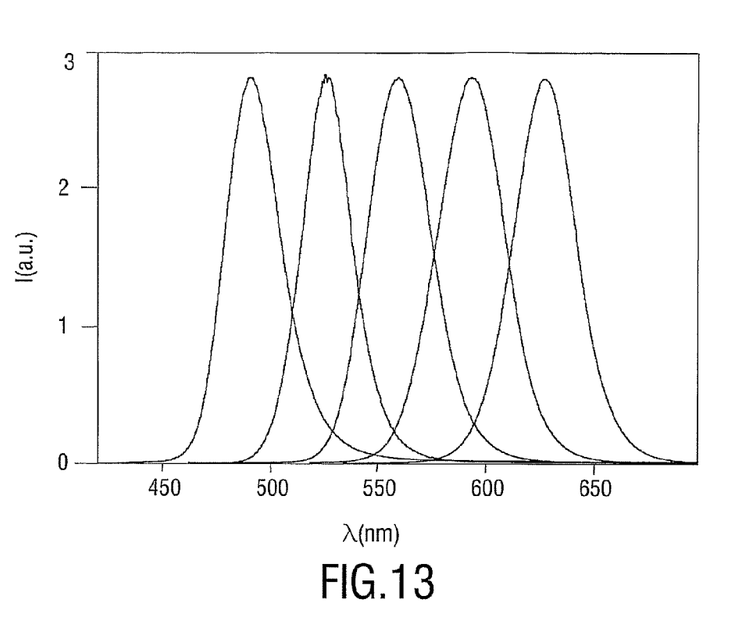
FIG. 13 is a graph showing emission spectra of five sizes of CdSe quantum dots.
Figure 14:
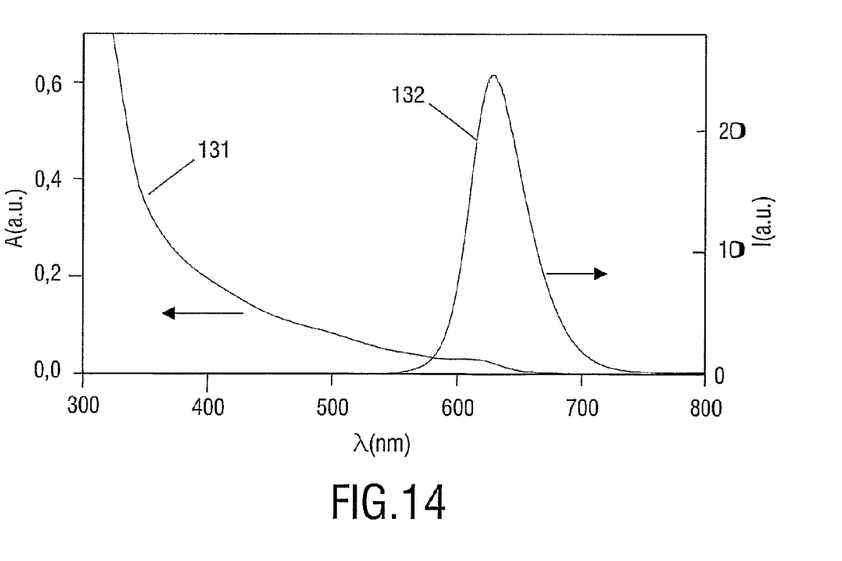
FIG. 14 is a graph showing absorption spectrum and emission spectrum a single quantum dot size.

In FIG. 13, the emission spectra of 5 sizes of CdSe quantum dots are shown. It can be seen that by changing the size of the quantum dots position of emission can be easily changed. In FIG. 14, the emission spectrum 132 of a selected quantum dot is shown together with its absorption spectrum 131.

The invention claimed is:

1. A color conversion cell for adjusting a color or color temperature of light from a light source having a first emission spectrum, the color conversion cell comprising
   a color converting substance in a matrix held between two electrodes, the color converting substance having a second emission spectrum different from the first emission spectrum, and
   a switchable reflector positioned behind the color converting substance such that the color converting substance is between the reflector and the light source, forming a switchable resonance structure for the first emission spectrum;
   the color conversion cell being shiftable between at least
   a first state wherein the reflector will at least substantially reflect source light incident on the cell, and
   the color converting substance will
     absorb a first ratio, A1, of light incident on the cell,
     emit light with the second emission spectrum, and
     transmit a second ratio, T1, of light incident on the cell, and
   a second state wherein the reflector will at least substantially transmit source light incident on the cell, and the first ratio, A2, is smaller than in the first state and wherein the second ratio, T2, is larger than in the first state.

2. The color conversion cell according to claim 1, wherein the color converting substance comprises anisometric color converting particles having a high absorption orientation and a low absorption orientation in relation to light incident on the cell, the color conversion cell further comprising means for, when the cell is in the first state, orienting the anisometric color converting particles at least substantially in their high absorption orientation relative to the source light illuminating the cell, and for, when the cell is in the second state, orienting the an isometric color converting particles at least substantially in their low absorption orientation relative to the source light illuminating the cell.

3. The color conversion cell according to claim 2, wherein the means for orienting comprises a liquid crystal material and wherein the an isometric color converting substance is mixed with liquid crystals to provide a controllable orientation of the an isometric particles.

4. The color conversion cell according to claim 2, wherein the means for orienting comprises a suspended particle device and wherein the anisometric color converting particles are suspended in the suspended particle device to provide a controllable orientation of the an isometric particles.

5. The color conversion cell according to claim 1, further comprising an electrowetting cell with the color converting substance mixed with a liquid.

6. The color conversion cell according to claim 1, wherein the color conversion cell is adapted to provide a longer average pathlength of the source light in the matrix containing the color converting substance inside the cell in its first state, than in its second state.

7. The color conversion cell according to claim 6, further comprising electrically controllable scattering media.

8. A light emitting device with adjustable color or color temperature comprising a light source having a first emission spectrum and a color conversion cell positioned to be illuminated by at least part of the light from the light source, the color conversion cell comprising
   a color converting substance in a matrix held between two electrodes, and
   a switchable reflector positioned behind the color converting substance such that the color converting substance is between the reflector and the light source, forming a switchable resonance structure for the first emission spectrum;
   the color converting substance having a second emission spectrum different from the first emission spectrum, the color conversion cell being shiftable between at least a first state wherein the reflector will at least substantially reflect source light incident on the cell, and
   the color converting substance will
     absorb a first ratio, A1, of light incident on the cell,
     emit light with the second emission spectrum, and
     transmit a second ratio, T1, of light incident on the cell, and
   second state wherein the reflector will at least substantially transmit source light incident on the cell, and the first ratio, A2, is smaller than in the first state and wherein the second ratio, T2, is larger than in the first state.

9. The light emitting device according to claim 8 comprising multiple color conversion cells comprising different color converting substances and being arranged behind one another as seen from the light source to allow light from the light source to illuminate a succeeding cell through a preceding cell.

10. A method for adjusting the color or color temperature of light from a light source having a first spectrum, the method comprising
    providing a color conversion cell comprising a color converting substance in a matrix held between two electrodes, and a switchable reflector positioned behind the color converting substance such that the color converting substance is between the reflector and the light source, forming a switchable resonance structure for the first emission spectrum,
    illuminating the matrix with the light source,
    absorbing at least part of the source light illuminating the matrix in/by the color converting substance,
    emitting light with a second emission spectrum from the color converting substance,
    adjusting a voltage between the two electrodes to switch on or off the resonance structure, thereby to increase or decrease the amount of source light absorbed by the color converting substance and the amount of light with a second emission spectrum emitted by the color converting substance.

* * * * *